United States Patent
Iino et al.

[11] Patent Number: 6,113,686
[45] Date of Patent: Sep. 5, 2000

[54] SINGLE CRYSTAL GROWING METHOD AND APPARATUS

[75] Inventors: Eiichi Iino; Yasushi Nakamura; Seiichiro Otsuka; Koji Midzuishi; Masanori Kimura; Hirotoshi Yamagishi, all of Annaka, Japan

[73] Assignee: Shin-Etsu Handotai Co., Ltd., Tokyo, Japan

[21] Appl. No.: 08/945,209

[22] PCT Filed: Apr. 22, 1996

[86] PCT No.: PCT/JP96/01089

§ 371 Date: Feb. 3, 1998

§ 102(e) Date: Feb. 3, 1998

[87] PCT Pub. No.: WO96/33301

PCT Pub. Date: Oct. 24, 1996

[30] Foreign Application Priority Data

Apr. 21, 1995 [JP] Japan ................................. 7-120680
Sep. 9, 1995 [JP] Japan ................................. 7-256892

[51] Int. Cl.[7] .................................................. C30B 15/00
[52] U.S. Cl. ............................ 117/13; 117/208; 117/900; 117/911
[58] Field of Search ............................. 117/13, 200, 201, 117/202, 208, 900, 911

[56] References Cited

U.S. PATENT DOCUMENTS 3,953,281 4/1976 Pantusco et al. .
5,126,113 6/1992 Yamagishi et al. .
5,326,113 7/1994 Montaluo, III .................... 279/2.09
5,858,088 1/1999 Hiraishi et al. .................... 117/218
5,879,451 3/1999 Mizuishi .......................... 117/208
5,885,347 3/1999 Tomioka et al. .................. 117/218

FOREIGN PATENT DOCUMENTS 5-232989 12/1984 Japan .
5-270975 10/1993 Japan .
5-319987 12/1993 Japan .

*Primary Examiner*—Felisa Hiteshew
*Attorney, Agent, or Firm*—Ronald R. Snider; Snider & Associates

[57] ABSTRACT

A method and apparatus for growing and manufacturing a single crystal according to a so-called Czochralski (CZ) method. A seed crystal 12 is connected to a tip end of a wire 41a as a hanging member 41 to pull and form a single crystal part 15, arm-shaped members 44a of a lifting jig 44 are engaged in a recess 16 of a corrugated portion 14 formed on the single crystal part 15 during the pulling operation, the pulling speeds of both of the arm-shaped members 44a and wire 41a are synchronously controlled to provide smooth transfer between the arm-shaped members 44a and wire 41a, whereby the single crystal part 15 is pulled always at a constant pulling speed. In particular, a heavy-weight single crystal can be safely pulled and formed without any dislocation therein while minimizing an impact force applied to the crystal.

20 Claims, 11 Drawing Sheets

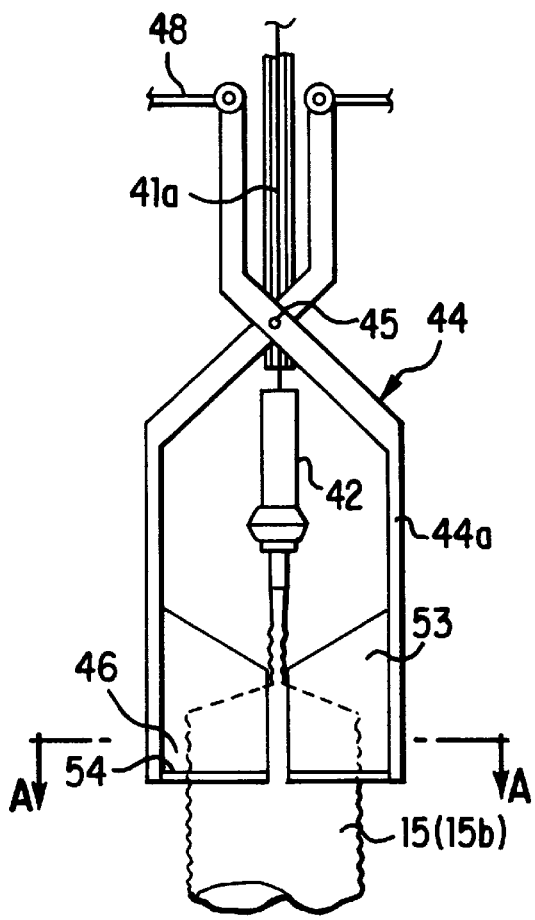
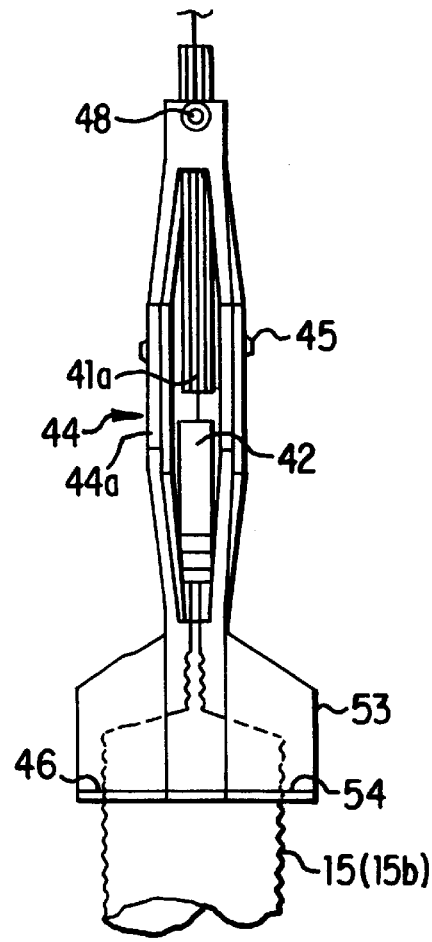
FIG.11(a)　　　　FIG.11(b)
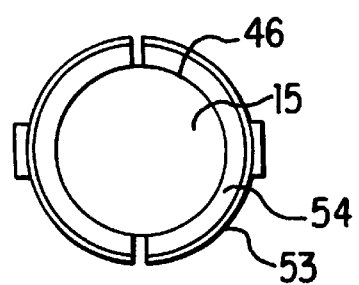
FIG.11(c)

SINGLE CRYSTAL GROWING METHOD AND APPARATUS

TECHNICAL FIELD

The present invention relates to single crystal growing methods and apparatuses for manufacturing a single crystal by a Czochralski (CZ) method and more particularly, to a single crystal growing method and apparatus for pulling and suitably manufacturing a heavy-weight single crystal safely without generation of dislocation.

BACKGROUND ART

As one of methods for pulling a single crystal from a crucible containing a melt of such semiconductor material as silicon, a Czochralski (CZ) method has been conventionally employed, which is schematically shown in FIG. 17. First of all, when a seed crystal 12 is brought into contact with a melt 10a within a crucible 10 installed in a heating chamber (not shown) and then pulled, moving-up operation of the seed crystal 12 at its pulling speed causes a neck part 13 to be formed in a lower part of the seed crystal 12. Then formed in a lower part of the neck part 13 is a single crystal part 15 (which is a combination of a cone-shaped part 15a and a straight body part 15b) which is dislocation free. Reference numeral 41 denotes a hanging member for pulling the seed crystal.

The single crystal part 15 has conventionally been as small as about 20–30 kg in weight and also small in diameter. In these years, however, for the purpose of increasing efficiency and yield in semiconductor production, the single crystal part 15 has been demanded to have an larger diameter and larger weight. For this reason, such a neck part 13 as shown in FIG. 17 has had a problem that it cannot safely support the single crystal part 15 as heavy as about 100–200 kg. In order to solve the problem, there have been employed a single crystal growing method and apparatus in which a corrugated portion 14 formed between the neck part 13 and single crystal part 15 is held as grasped by a pair of lifting jig 14a and pulled, as shown in, e.g., FIG. 18.

Well known techniques substantially similar to such a growing method as shown in FIG. 18 are disclosed, e.g., in Japanese Patent Application Laid-Open Publication Nos. 62-288191, 63-252991, 3-285893 and 3-295893, which have all different features. In Japanese Patent Application Laid-Open Publication No. 3-285893, for example, a seed crystal is first pulled by a wire connected to the seed crystal, a narrow part (corresponding to the corrugated portion 14 in the aforementioned example) as a pulled part formed following the seed crystal is grasped by a grasping lever (corresponding to the aforementioned lifting jig 14a) located at a predetermined position, and then the single crystal is further pulled by the wire and lever.

The neck part 13 shown in FIG. 17 generally has a diameter of about 3–4 mm and has a strength insufficient to pull the heavy-weight single crystal part 15. To avoid this problem, there is disclosed in Japanese Patent Application Laid-Open Publication No. 5-43379 a technique in which pulling conditions are devised so that the neck part 13 can have a diameter of 4.5 mm–10 mm. However, this method is insufficient to form the single crystal part 15 safely and without generation of dislocation.

Methods for solving the above problem includes the techniques shown in FIG. 18 and disclosed in the aforementioned Publications. However, these prior arts have problems which follow. First, in order to form the aforementioned corrugated portion 14, it is necessary to adjust the pulling rate or speed of the seed crystal 12 and the temperature of the melt within the crucible, and it is per se difficult to form the corrugated portion 14 in a desired shape at a fixed position.

For this reason, it is preferable that the single crystal can be held by a raised and recessed portion (verge: Journal of Crystal Growth 52(1981)391–395) in a neck part formed to cause dislocation to disappear from the single crystal or by a part of finely fluctuated diameters caused during the growth of the single crystal.

Thus, when the lifting jig 14a having a constant arm length is installed at a fixed position as in the above known technique, an engagement position between the lifting jig 14a and corrugated portion 14 is not stable, which tends to involve such a problem that the engagement becomes insufficient. Further, the lifting jig 14a and its holding portion are positioned relatively in the vicinity of the crucible 10 at a high temperature as shown in FIG. 18, which requires the jig to be made of special material, which leads to the fact that the jig becomes expensive and the member material thereof may become a cause of contamination in the melt of the crucible 10.

The biggest problem is that it is difficult to engage the lifting jig 14a with the corrugated portion 14 or with the single crystal part 15 being pulled as rotated under a condition of no impact force. Even a slight impact force applied to the single crystal part 15 during the formation of the single crystal part 15 results in generation of dislocation in the crystal. Accordingly, in order to form a good quality of single crystal part 15, it is necessary to engage the lifting jig 14a under a condition of no impact force. However, no consideration is paid to this respect in the aforementioned prior arts.

It is therefore an object of the present invention to provide a single crystal growing method and apparatus which can solve the above problems in the prior art, can realize safe and reliable pulling operation of a heavy-weight single crystal, can minimize an impact force caused when a crystal is held, and can reliably prevent the generation of dislocation in the crystal.

DISCLOSURE OF INVENTION

In accordance with the present invention, there is provided a method for growing a single crystal having a neck part continuously connected to a seed crystal, a cone part and a straight body part, which method is characterized in that said neck part, cone part and straight body part are formed by pulling a hanging member connected to said seed crystal, a lifting jig is engaged in a recess in a corrugated portion on a surface of said single crystal which is moved up to a predetermined position by raising the hanging member, a load pulled by the hanging member is shifted to the lifting jig and thereafter pulling operation of the single crystal is carried out by the lifting jig (Invention 1).

In accordance with the present invention, there is provided a method for growing a single crystal having a neck part under a seed crystal, a cone part, an inverted right cone part having a taper of 0.1–0.3 and a straight body part in this order; which method is characterized in that a lifting jig is engaged with an outer peripheral surface of said inverted right cone part which is moved up to a predetermined position by raising the hanging member connected to said seed crystal, a load pulled by the hanging member is shifted to the lifting jig and thereafter pulling operation of the single crystal is carried out by the lifting jig (Invention 2).

The single crystal growing method of the present invention is characterized in that the corrugated portion on said single crystal surface is formed resulting from fine fluctuations in diameter caused by variations in temperature, pulling speed and convection during growth of said single crystal (Invention 3).

The single crystal growing method of the present invention is characterized in that a corrugated portion of said neck part is formed as a verge for the purpose of causing dislocation to disappear from the single crystal (Invention 4).

The single crystal growing method of the present invention is characterized in that said neck part, said cone part and a corrugated portion of said straight body part are intentionally formed (Invention 5).

The single crystal growing method of the present invention is characterized in that said inverted right cone part is formed by controlling at least one of a pulling speed of the single crystal and a temperature of a melt within a crucible (Invention 6).

The single crystal growing method of the present invention is characterized in that a pulling speed $V_B$ of said lifting jig is increased gradually from zero immediately after the engagement of said lifting jig so that a speed V corresponding to an addition of said pulling speed $V_B$ of the lifting jig to a pulling speed $V_A$ of said hanging member after the engagement of said lifting jig is equal to a pulling speed $V_{SE}$ of said hanging member immediately before said lifting jig is engaged and in synchronism therewith, the pulling speed $V_A$ of said hanging member is decreased gradually from the speed $V_{SE}$ (Invention 7).

The single crystal growing method of the present invention is characterized in that a load pulled by said hanging member is measured so that, after a measured load value becomes zero, the pulling speed $V_A$ of the hanging member is set at zero (Invention 8).

In accordance with the present invention, there is provided an apparatus for growing a dislocation-free single crystal having a neck part continuously connected to a seed crystal, a cone part and a straight body part, which is characterized in that said neck part continuously connected to said seed crystal, said one part and a part of said straight body part are formed, said single crystal is hanged by a hanging member connected to said seed crystal and by a lifting jig engaged in a recessed portion of a corrugated portion on a surface of said single crystal, said dislocation-free single crystal is formed by pulling the single crystal without applying any vibration or impact on the single crystal, and said hanging member and lifting jig are provided to be moved up and down independently of each other (Invention 9).

In accordance with the present invention, there is provided an apparatus for growing a dislocation-free single crystal having a neck part under a seed crystal, a cone part, an inverted right cone part having a taper of 0.1–0.3 and a straight body part in this order, which is characterized in that said single crystal is hanged by a hanging member connected to said seed crystal and by a lifting jig engaged with an outer peripheral surface of said inverted right cone part, said single crystal is formed by pulling the dislocation-free single crystal without applying any vibration and impact on the single crystal, and said hanging member and lifting jig are provided to be moved up and down independently of each other (Invention 10).

In accordance with the present invention, there is provided an apparatus for growing a dislocation-free single crystal having a neck part continuously connected to a seed crystal, a cone part and a straight body part, which is characterized in that said neck part continuously connected to said seed crystal, said cone part and a part of said straight body part are formed, said single crystal is hanged by a hanging member connected to said seed crystal and by a lifting jig engaged in a recessed portion of a corrugated portion on a surface of said single crystal, said dislocation-free single crystal is formed by pulling the single crystal without applying any vibration or impact on the single crystal; said apparatus comprising a slider disposed as opposed to a crucible containing a melt of semiconductor material, a slider moving mechanism engaged with said slider for moving and guiding the slider in a vertical direction at a speed $V_B$, a retaining case pivotably supported on said slider moving mechanism, a mechanism for rotating said retaining case, a hanging member moving up/down mechanism provided in said retaining case for moving the hanging member connected to said seed crystal at a speed $V_A$, load measuring means for measuring a load applied to the hanging member moving up/down mechanism as the hanging member is moved, lifting jig driving mechanism for moving said lifting jig provided in said retaining case to be releasably engaged in a recess in said corrugated portion toward said recess or away therefrom, and a controller connected to said slider moving mechanism, retaining-case rotating mechanism, hanging-member moving up/down mechanism, load measuring means and lifting-jig driving mechanism for performing synchronous control over these mechanisms and means; said controller controls said speeds $V_A$ and $V_B$ at least in such a manner that an addition of the pulling speed $V_A$ of said hanging member by said hanging-member moving up/down mechanism and the speed $V_B$ of the lifting jig to be engaged in said recess becomes equal to a pulling speed $V_{SE}$ of said hanging member immediately before said lifting jig is engaged in said recess (Invention 11).

In accordance with the present invention, there is provided an apparatus for growing a dislocation-free single crystal having a neck part under a seed crystal, a cone part, an inverted right cone part having a taper of 0.1–0.3 and a straight body part in this order, which is characterized in that said single crystal is hanged by a hanging member connected to said seed crystal and by a lifting jig engaged with an outer peripheral surface of said inverted right cone part, said single crystal is formed by pulling the dislocation-free single crystal without applying any vibration and impact on the single crystal; said apparatus comprising a slider disposed as opposed to a crucible containing a melt of semiconductor material, a slider moving mechanism engaged with said slider for moving and guiding the slider in a vertical direction at a speed $V_B$, a retaining case pivotably supported on said slider moving mechanism, a mechanism for rotating said retaining case, a hanging member moving up/down mechanism provided in said retaining case for moving the hanging member connected to said seed crystal at a speed $V_A$, load measuring means for measuring a load applied to the hanging member moving up/down mechanism as the hanging member is moved, lifting-jig driving mechanism for moving said lifting jig provided in said retaining case to be releasably engaged in an outer peripheral surface of said inverted right cone part toward said outer peripheral surface or away therefrom, and a controller connected to said slider moving mechanism, retaining-case rotating mechanism, hanging-member moving up/down mechanism, load measuring means and lifting-jig driving mechanism for performing synchronous control over these mechanisms and means; said controller controls said speeds $V_A$ and $V_B$ at least in such a manner that an addition of the pulling speed $V_A$ of said hanging member by said hanging-member moving up/down mechanism and the speed $V_B$ of the lifting jig to be engaged on an outer peripheral surface of said inverted right cone part becomes equal to a pulling speed $V_{SE}$ of said hanging member immediately before said lifting jig is engaged on the outer peripheral surface of said inverted right cone part (Invention 12).

A single crystal growing apparatus of the present invention is characterized in that moving-up speeds of said hanging member and lifting jig are controlled by a diameter controller (Invention 13).

A single crystal growing apparatus of the present invention is characterized in that said crucible is provided within a heating chamber, a crystal unloading chamber is provided above said heating chamber, and said crystal unloading chamber is formed to be expanded and contracted in its vertical direction (Invention 14).

A single crystal growing apparatus of the present invention is characterized in that said crystal unloading chamber comprises a bellows (Invention 15).

A single crystal growing apparatus of the present invention is characterized in that said lifting jig comprises a pair of arm-shaped members intermediate parts of which are pivoted to said retaining case and which are provided at their lower ends with engagements to be engaged in the recess of said corrugated portion, and said lifting-jig driving mechanism comprises a pair of hydraulic cylinders or motors coupled to upper ends of said arm-shaped members (Invention 16).

A single crystal growing apparatus of the present invention is characterized in that said lifting jig comprises a pair of arm-shaped members intermediate parts of which are pivoted to said retaining case and which are provided at their lower ends with engagements to be engaged with an outer peripheral surface of said inverted right cone part, and said lifting-jig driving mechanism comprises a pair of hydraulic cylinders or motors coupled to upper ends of said arm-shaped members (Invention 17).

A single crystal growing apparatus of the present invention is characterized in that said engagements are integrally formed with said arm-shaped members (Invention 18).

A single crystal growing apparatus of the present invention is characterized in that said means for detecting positions of surfaces of said neck part, cone part and straight body part of the single crystal pulled by said hanging member are disposed at predetermined positions on an immobile side of said apparatus (Invention 19).

A single crystal growing apparatus of the present invention is characterized in that detection means for detecting positions of surfaces of said neck part, cone part, inverted right cone part and straight body part of the single crystal pulled by said hanging member are disposed at predetermined positions on an immoble side of said apparatus (Invention 20).

In this way, in the single crystal growing apparatus as set forth as the invention 11, the seed crystal is provided to the tip end of the hanging member, the seed crystal is brought into contact with the melt within the crucible, and the rotating mechanism is actuated while the hanging member is pulled upwardly by the hanging member moving up/down mechanism. Through the adjustment of the pulling speed, the neck part, cone part and straight body part (both of the cone and straight body parts are connectively referred to as the single crystal part) are formed. When the detection means detect the predetermined positions of the neck, cone and straight body parts pulled, the lifting-jig driving mechanism is actuated so that the lifting jig is engaged in the recess in the corrugated portion on the surface of the single crystal, while the lifting jig is moved up by the slider moving mechanism simultaneously with the above engagement at the speed $V_B$ and is also rotated by the rotating mechanism. Assuming that the pulling speed of the hanging member immediately before the lifting jig is engaged in the recess of the corrugated portion on the surface of the single crystal is denoted by $V_{SE}$, then the speeds of the hanging member and lifting jig are controlled so that, during a constant time immediately after the lifting jig is engaged in the recess in the corrugated portion, the addition of the pulling speed $V_A$ of the hanging member and the pulling speed $V_B$ of the hanging holder becomes equal to the speed $V_{SE}$. Thereby the transfer from the hanging member to the lifting jig can be smoothly carried out to thereby prevent generation of an impact force. After the load of the hanging member became zero, the pulling and rotation of only the lifting jig cause the single crystal part to be stably pulled, so that the single crystal part can have a predetermined shape.

Further, in the single crystal growing apparatus as set forth as the invention 12, the seed crystal is provided to the tip end of the hanging member, the seed crystal is brought into contact with the melt within the crucible, and the rotating mechanism is actuated while the hanging member is pulled by the hanging member moving up/down mechanism. Through the adjustment of the pulling speed, the neck part, cone part and inverted right cone part are formed. When the detection means detects that the inverted right cone part was pulled to the predetermined positions, the lifting-jig driving mechanism is actuated so that the lifting jig is engaged with the other peripheral surface of the inverted right cone part, while the lifting jig is moved up by the slider moving mechanism simultaneously with the above engagement at the speed $V_B$ and is also rotated by the rotating mechanism. Assuming that the pulling speed of the hanging member immediately before the lifting jig is engaged with the outer peripheral surface of the inverted right cone part is denoted by $V_{SE}$, then the speeds of the hanging member and lifting jig are controlled so that, during a constant time immediately after the lifting jig is engaged with the outer peripheral surface, the addition of the pulling speed $V_A$ of the hanging member and the pulling speed $V_B$ of the lifting jig becomes equal to the speed $V_{SE}$. Thereby the transfer from the hanging member to the lifting jig can be smoothly carried out to thereby prevent generation of an impact force. After the load of the hanging member became zero, the pulling and rotation of only the lifting jig cause the entire single crystal to be stably pulled, so that the single crystal part can have a predetermined shape.

BRIEF DESCRIPTION OF THE DRAWINGS

FIG. 11 shows details of an example of the lifting jig, in which (a) is a front view thereof, (b) is a side view and (c) is a cross-sectional view taken along line A—A in the front view;

BEST MODE FOR CARRYING OUT THE INVENTION

The present invention will be explained in detail with reference to the accompanying drawings.

Embodiment 1

Figure 1:
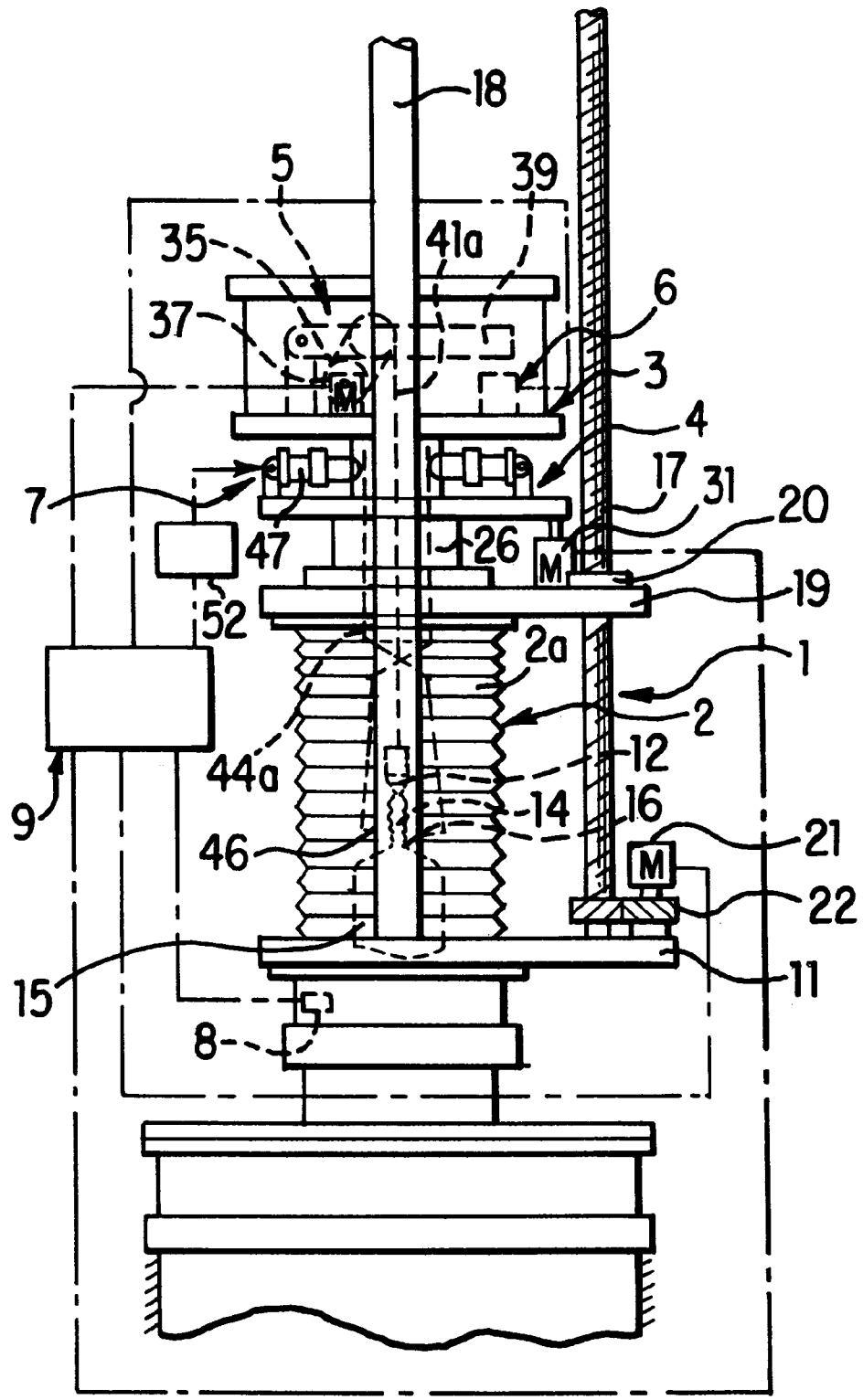
FIG. 1 is a general arrangement of an embodiment of the present invention.
Figure 2:
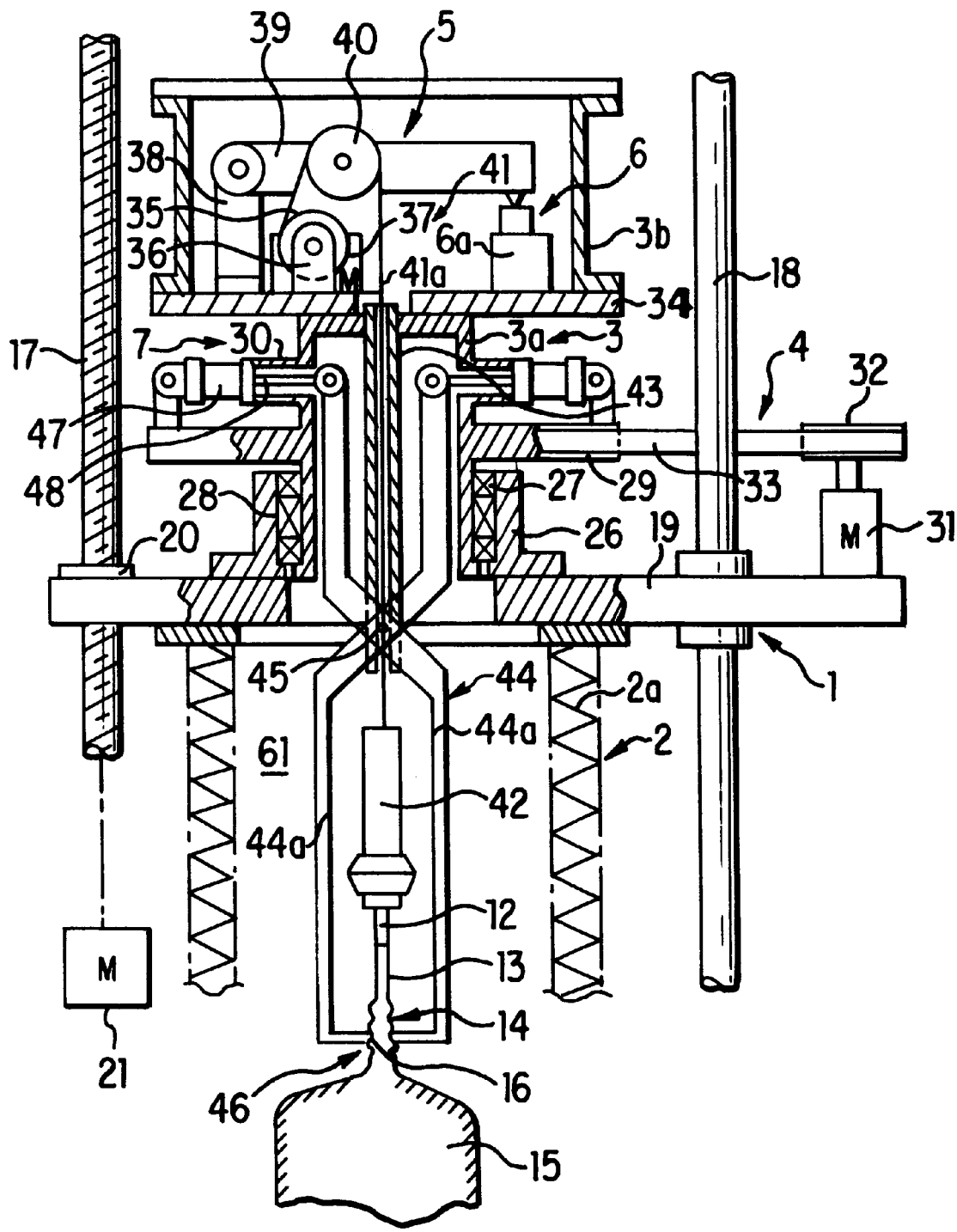
FIG. 2 is an axial cross-sectional view of a detailed structure of a hanging members and holding apparatus therearound in the same embodiment.
Figure 3:
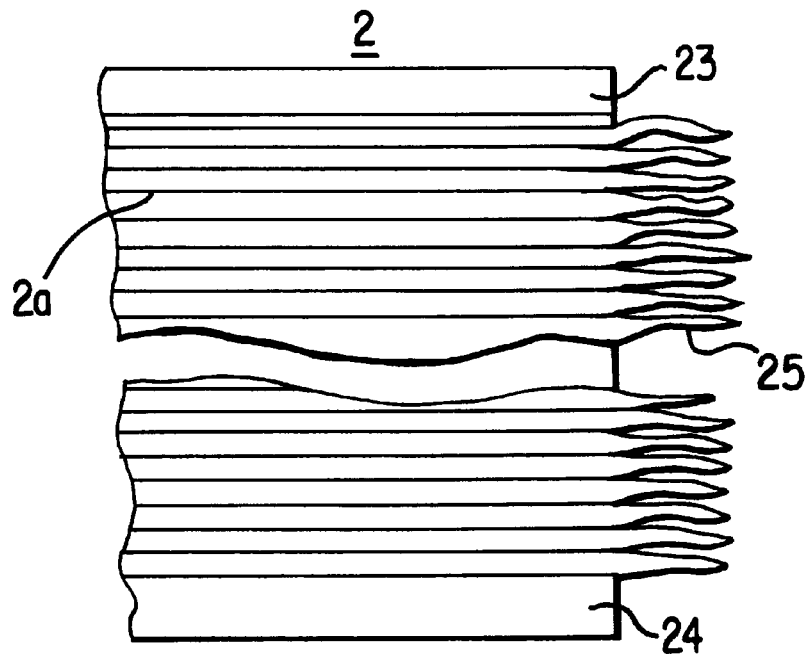
FIG. 3 is an axial cross-sectional view of a part of a schematic structure of a bellows as a flexible elastic member in the same embodiment.
Figure 4:
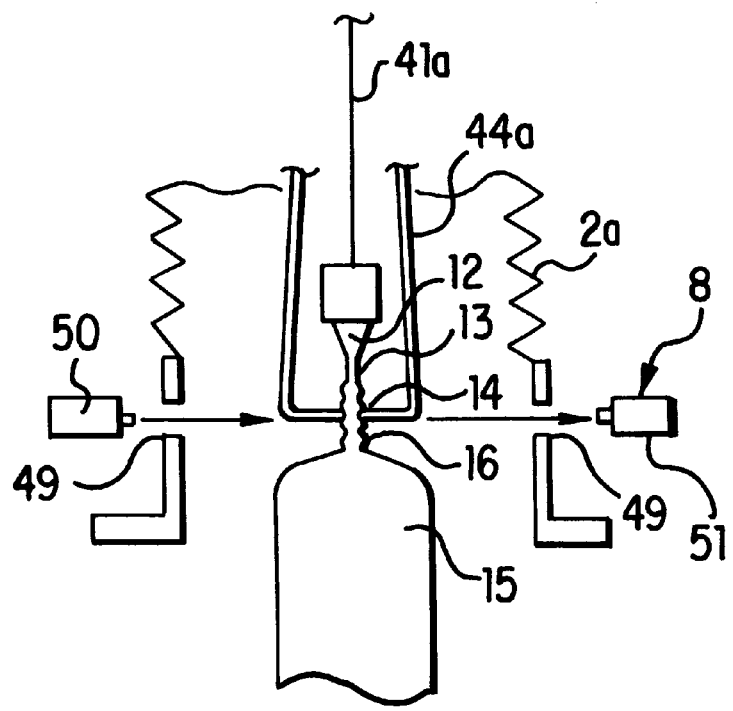
FIG. 4 is an axial cross-sectional view of a part of a detection means.
Figure 6:
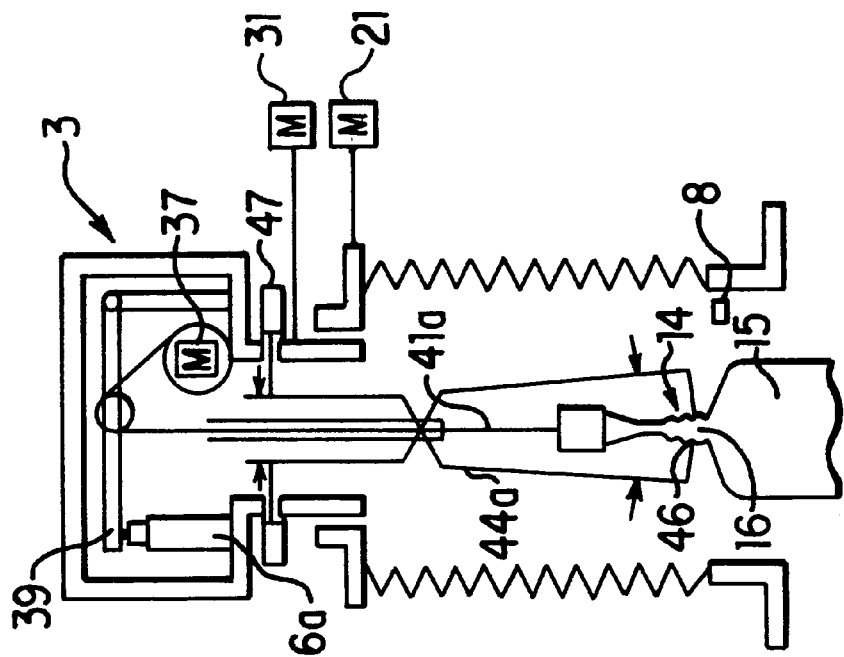
FIG. 6 is an axial cross-sectional view for explaining a condition in which the single crystal is held by a lifting jig in the embodiment.
Figure 5:
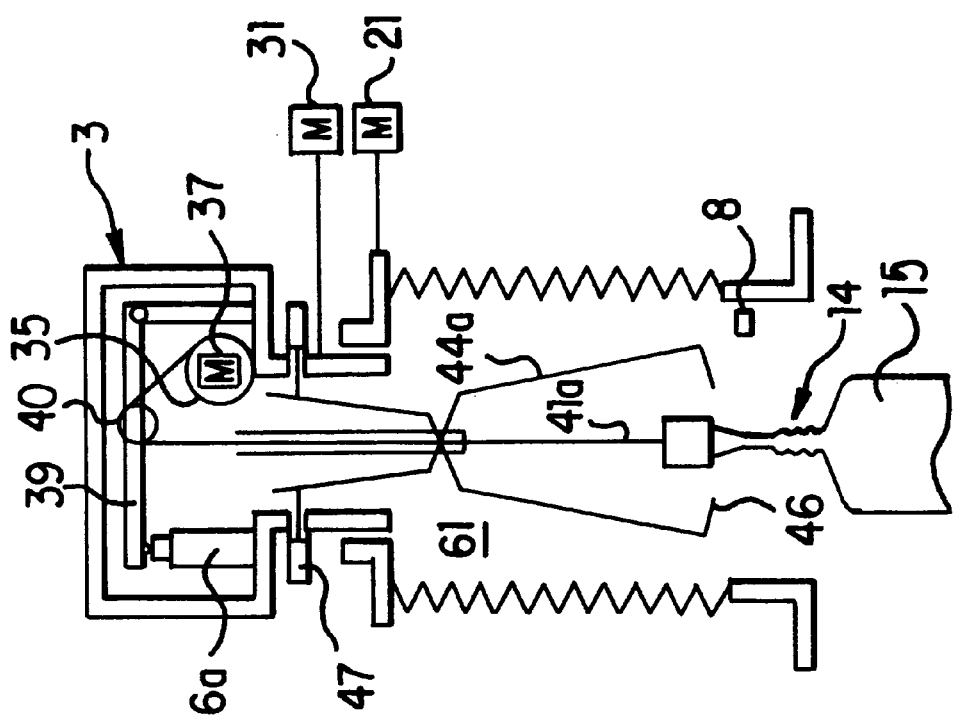
FIG. 5 is an axial cross-sectional view for explaining pulling operation of a single crystal in the embodiment.
Figure 8:
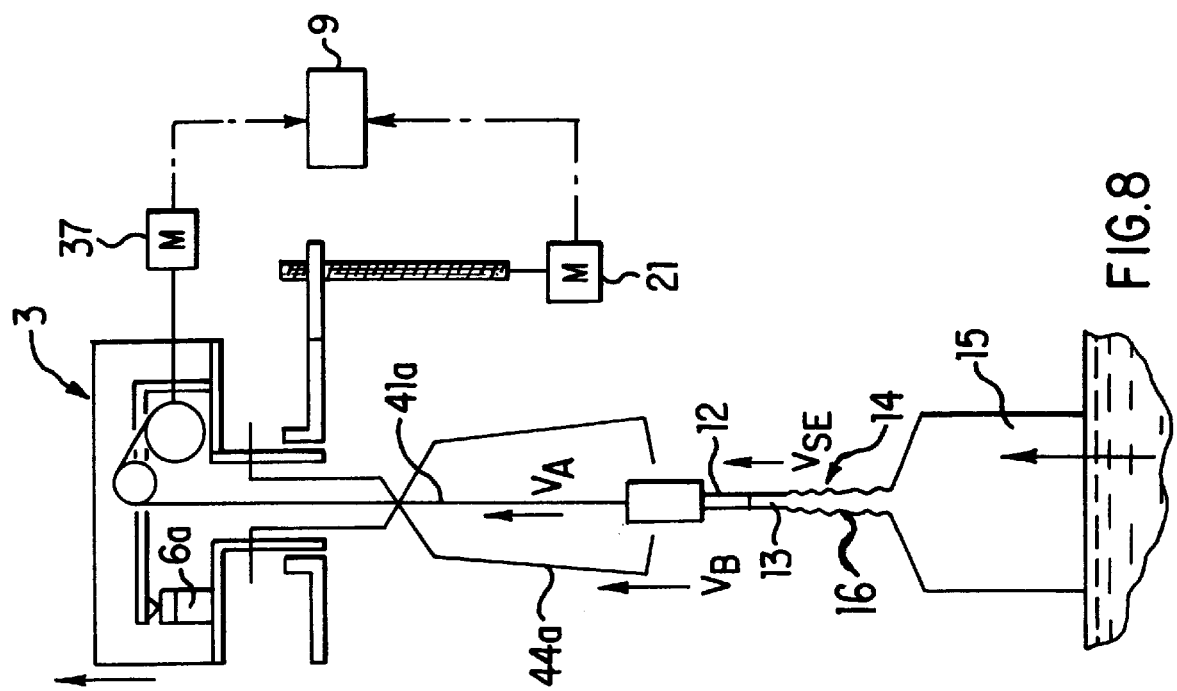
FIG. 8 is an axial cross-sectional view for explaining transfer of the single crystal from a hanging member to the lifting jig.
Figure 7:
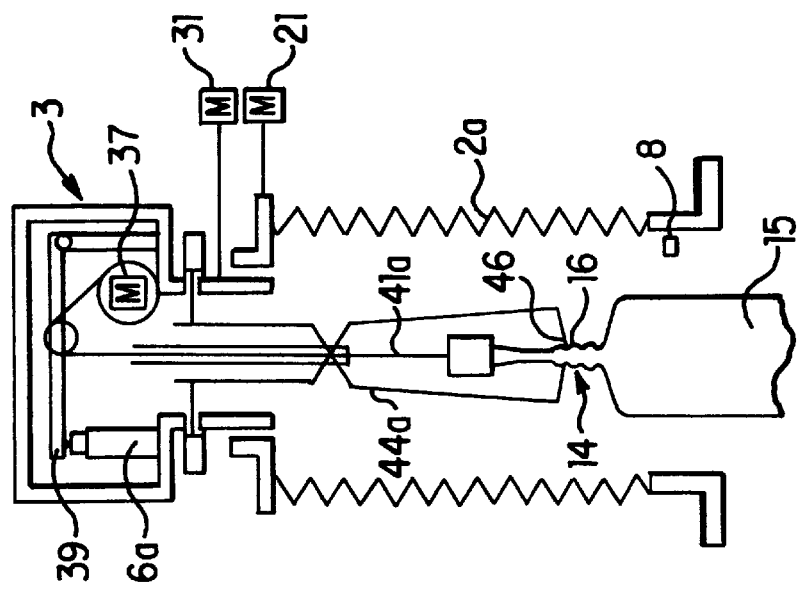
FIG. 7 is an axial cross-sectional view for explaining a condition in which the single crystal is pulled by the lifting jig in the embodiment.
Figure 9:
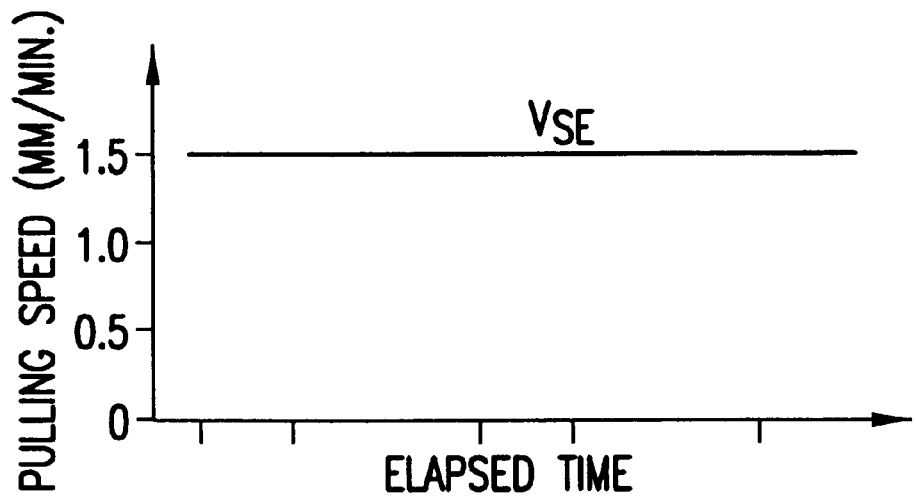
FIG. 9 is a diagram showing a relationship between elapsed time of single-crystal pulling operation by the hanging member and pulling rate of the hanging member.
Figure 10:
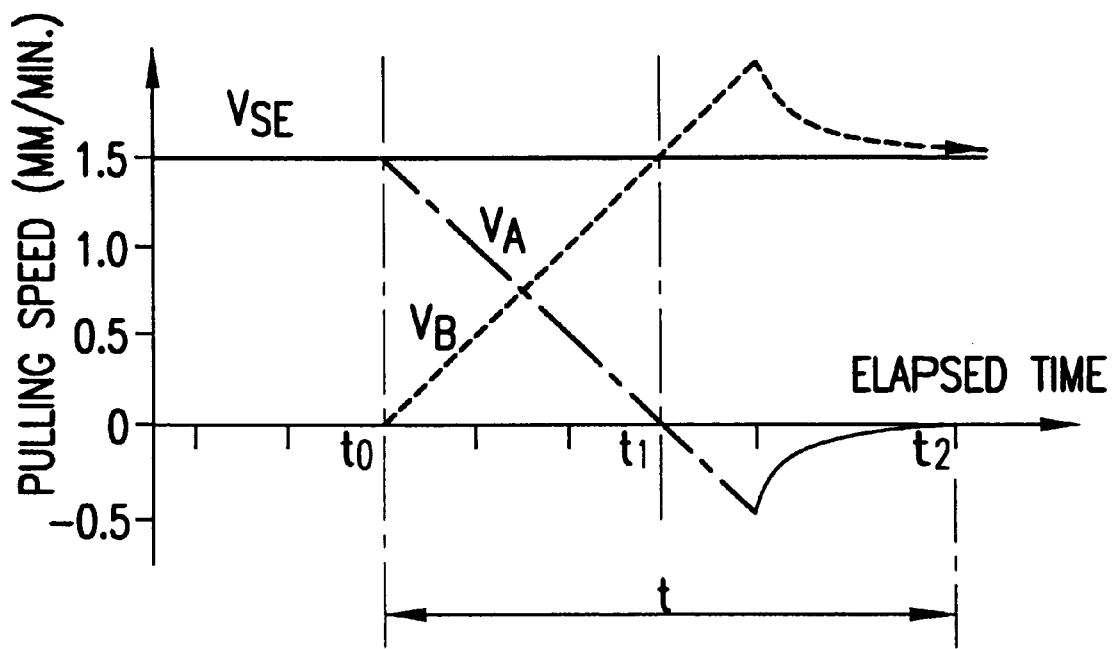
FIG. 10 is a diagram showing a relationship between the elapsed time, and hanging-member puling rate and lifting jig moving rate when the single crystal is transferred from the hanging member to the lifting jig.
Figure 12:
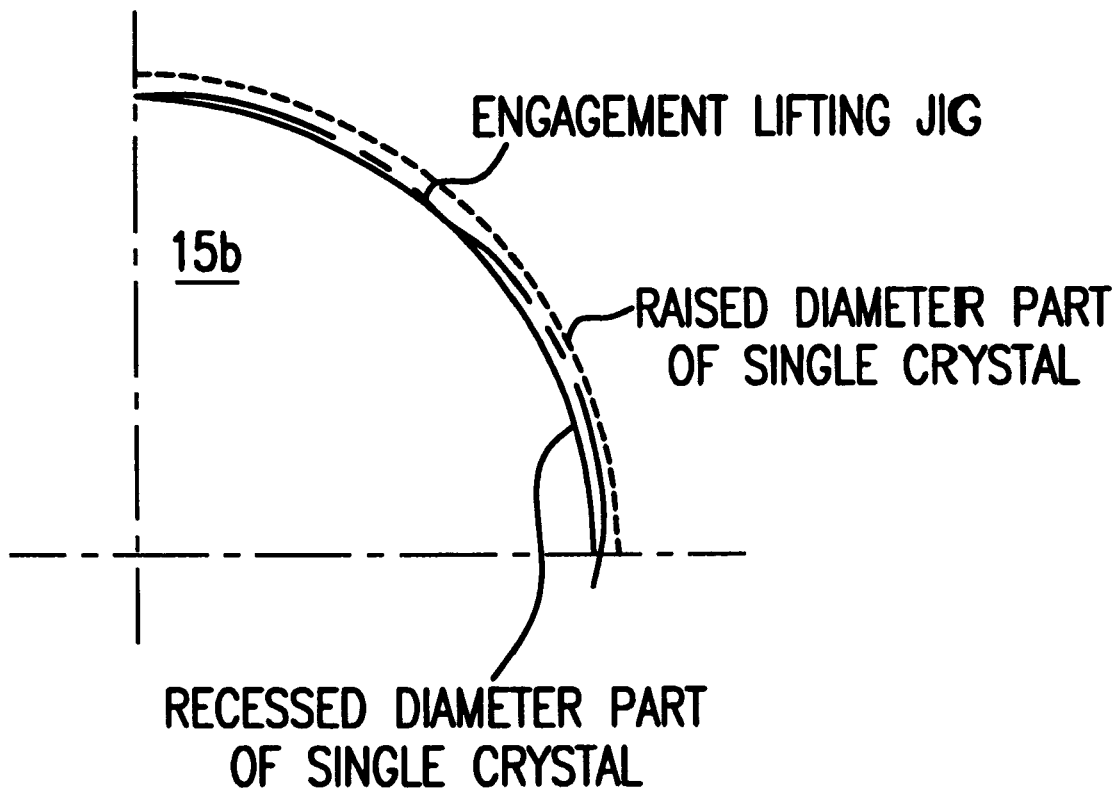
FIG. 12 is a diagram for explaining a positional relationship among an engaged part of the lifting jig and diameters of corrugated parts of the single crystal.

FIG. 1 is a general arrangement of the present embodiment, FIG. 2 is an axial cross-sectional view of a detailed structure of a hanging members and holding apparatus therearound, FIG. 3 is an axial cross-sectional view of a part of a schematic structure of a bellows as a flexible elastic member in the present embodiment, FIG. 4 is an axial cross-sectional view of a part of a detection means, FIGS. 5 to 7 are axial cross-sectional views for explaining the operation of the present embodiment, FIG. 8 is an axial cross-sectional view for explaining transfer of the single crystal from a hanging member to the lifting jig, FIG. 9 is a diagram showing a relationship between elapsed time of single-crystal pulling operation by the hanging member and pulling rate, FIG. 10 is a diagram showing changes in the rates of the hanging member and lifting jig when the single crystal is transferred from the hanging member to the lifting jig, FIG. 11 shows details of an example of the lifting jig, in which (a) is a front view, (b) is a side view and (c) is a cross-sectional view taken along line A—A in the front view, and FIG. 12 is a diagram for explaining a positional relationship among an engaged part of the lifting jig and diameters of corrugated parts of the single crystal.

Explanation will first be made as to a structure of a single crystal growing apparatus by referring to FIGS. 1 and 2. The growth apparatus roughly comprises a slider moving mechanism 1, a flexible elastic member 2, a retaining case 3, a rotary mechanism 4 for rotating the retaining case 3, a hanging-member moving up/down mechanism 5, a load measuring means 6, a lifting-jig driving mechanism 7, a detection means 8 and a controller 9. A crucible (not shown) containing a melt of such semiconductor material as silicon is installed on an immobile side, and a flange 11 is provided above the crucible.

With the growing apparatus of the present embodiment, as shown in FIG. 2, a neck part 13 connected to a seed crystal 12 is formed at its lower side with a corrugated portion 14. A dislocation-free single crystal part 15 is formed at a lower side of the portion 14. This growing method is a well known technique and thus explanation thereof is omitted. An engagement part 46 of a lifting jig 44 is engaged in a recess 16 in the corrugated portion 14.

Explanation will be made as to the slider moving mechanism 1. Erected on the flange 11 are a ball screw 17 and a guide shaft 18. A slider 19 is positioned as opposed to the flange 11 and parallel thereto. A nut member 20 threadedly receiving the ball screw 17 is fixedly mounted on the slider 19. The slider 19 is slidably supported by the guide shaft 18. Disposed on a lower end side of the ball screw 17 is a driving mechanism 22 (see FIG. 1) coupled to a motor 21. With such a structure, when the motor 21 is driven, the slider 19 is vertically moved up or down as guided by the guide shaft 18 through the ball screw 17.

A crystal unloading chamber is defined in the flexible elastic member 2 disposed between the slider 19 and flange 11. In the present embodiment, a bellows 2a is employed as the flexible elastic member 2. The bellows 2a has such an axial cross-sectional shape as shown in FIG. 3, as well known. The bellows 2a is made in the form of a hollow cylinder, the cylinder is provided on its outer upper and lower sides with flange plates 23 and 24, between which a multiplicity of flexible sheets 25 having a suitable span are disposed at a suitable pitch. The flexible sheets 25 are made by molding and welding plates of stainless steel or titanium, and have linear spring characteristics and have a substantially negligible hysteresis loss. Further, the flexible sheets are also large in the rate of change of volume and excellent in pressure and heat resistances and also in durability.

As shown in FIG. 2, the retaining case 3 is pivotably mounted on a retainer 26 fixedly mounted on the slider 19 through a bearing 27. In this connection, the retaining case 3 is made up of first and second retaining cases 3a and 3b fixedly connected to each other. The first retaining case 3a, which is a hollow cylinder, is carried on the retainer 26 by the bearing 27. Disposed between the retainer and bearing is a magnetic seal 28. The first retaining case 3a has a large-diametered pulley 29, and a boss 30, on which boss the lifting-jig driving mechanism 7 is mounted. The boss 30 is open to the interior of the case 3a. On the other hand, the second retaining case 3b is a hollow box mounted on the first retaining case 3a. Accommodated within the second retaining case are the hanging-member moving up/down mechanism 5 and load measuring means 6, which will be explained later.

The rotary mechanism 4 includes a motor 31, a pulley 32 coupled to the motor, and a pulley belt 33 fitted between the pulley 29 of the first retaining case 3a and 32 therearound. When the motor 31 is driven, the entire retaining case 3 is rotated. In this case, the motor 31 is mounted on the slider 19.

Explanation will next be made as to the hanging-member moving up/down mechanism 5 and load measuring means 6. As shown in FIG. 2, a support bracket 36 for supporting a pulley 35, a motor 37 for drivingly rotating the pulley 35, a support column 38, etc. are mounted on a bottom plate 34 of the second retaining case 3b. Supported in the support column 38 by a pin is a base end of a lever member 39 in a cantilever manner. A pulley 40 is pivotably mounted on an intermediate part of the lever member 39. A tip end of the lever member 39 is carried by a load cell 6a which forms one of the load measuring means 6.

Meanwhile, the hanging member 41, which comprises a wire 41a in the present embodiment, is wound around the pulley 35 through the pulley 40. Connected to a lower end of the wire 41a is the seed crystal 12 through a seed chuck 42. The wire 41a is passed through a guide tube 43 fixed vertically to a center of the first retaining case 3a to thereby prevent interference with other ambient constituent parts.

With such a structure as mentioned above, when the motor 37 is driven, the wire 41a is wound around the pulley 35 to go up or down, whereby a load pulled by the wire 41a is applied to the load cell 6a from the pulley 40 through the lever member 39.

Explanation will next be made as to the lifting-jig driving mechansim 7. The lifting jig 44 disposed vertically as opposed thereto has a pair of arm-shaped members 44a and 44a in the present embodiment. These arm-shaped members 44a and 44a are disposed as crossed at their intermediate parts and interconnected by a pin 45. The arm-shaped member 44a has an engagement part 46 at its tip end.

Meanwhile, the arm-shaped member 44a is connected at its upper end to piston rod 48 of hydraulic cylinder 47 by means of pin. The hydraulic cylinder 47 is fixed to the boss 30 of the first retaining case 3a. The hydraulic cylinder 47 may be replaced by a motor (not shown) for reciprocating the piston rod 48 and its driving mechanism (not shown).

With such a structure as mentioned above, when the hydraulic cylinders 47 are actuated, the tip ends of the arm-shaped members 44a and 44a move toward or away from each other and thus the engagement parts 46 move toward or away from the recess 16 of the corrugated portion 14 to be engaged therewith or disengaged therefrom.

As shown in FIG. 1, the detection means 8 is provided for detecting such a position of the interconnection between the corrugated portion 14 of the single crystal which is being pulled and the single crystal part 15 as the recess 16. More specifically, as shown in FIG. 4, the detection means is made up of a laser beam transmitter 50 and a laser beam receiver 51 which are positioned close to respective apertures 49 and 49. Of course, the detection means is not limited to the laser beam transmitter and receiver but may comprise a CCD camera and a line sensor.

In this conjunction, the above corrugated portion 14 includes (1) a corrugated portion caused by fluctuations in the convection and temperature of the melt within the crucible and by the pulling rate of the single crystal, (2) a corrugated portion (verge) formed for the purpose of extinguishing dislocation from the single crystal, and (3) a corrugated portion intentionally formed under control of the convection and temperature of the melt within the crucible and by the pulling rate of the single crystal. When such a corrugated portion is intentionally formed, a diameter controller not shown can be used and such well-known one as disclosed in, e.g., Japanese Patent Application Laid-Open Publication No. 3-137092 may be employed.

As shown in FIG. 1, the controller 9 is connected to the motor 21, motor 31, motor 37, load cell 6a, hydraulic unit 52, hydraulic cylinders 47, detection means 8 and so on to automatically control these parts, which controlling operation will be explained later.

Next, the operation of the present embodiment will be explained. As shown in FIG. 5, first of all, the wire 41a having the seed crystal 12 connected at its tip end is pulled by driving the motor 37.

This causes the single crystal having the corrugated portion 14 and single crystal part 15 to be pulled. At the same time, the motor 31 is driven to rotate the retaining case 3. In this case, the motor 21 for moving the retaining case 3 is not driven. Accordingly, the arm-shaped members 44a and 44a of the lifting jig 44 are located at a predetermined position and the engagement parts 46 at the tip ends of the arm members are kept open. It goes without saying that since the wire 41a is pulled by such a load as the single crystal part 15, the load is applied to the load cell 6a.

When the wire 41a is further pulled and a position of the corrugated portion 14 is detected by the detection means 8, the controller 9 (see FIG. 1) actuates the hydraulic cylinders 47 of the lifting-jig driving mechanism 7. Thus, as shown in FIG. 6, the arm-shaped members 44a are moved to their closing directions so that the engagement parts 46 come into engaged contact with the recess 16 of the corrugated portion 14. Under this condition, the pulling operation of the wire 41a is continued and the wire 41a and arm-shaped members 44a are simultaneously rotated by rotating the retaining case 3 by the motor 31. Next, the motor 21 is driven to move up the retaining case 3 as shown in FIG. 7. This causes pulling of the single crystal part 15 held by the arm-shaped members 44a.

The bellows 2a are bridged between the flange 11 and slider 19 to define a crystal unloading chamber 61. In order to pull the single crystal part 15 with the corrugated portion 14 held by the arm-shaped members 44a, it is necessary to smoothly shift the pulling operation from the wire 41a to the arm-shaped members 44a and also necessary to obtain a smooth engagement between the engagement parts 46 of the arm-shaped members 44a and the recess 16.

First, with respect to the engagement between the engagement parts 46 and recess 16, there is no problem therewith, since the engagement parts 46 are formed into an arcuate shape and the engagement position is specified by the detection means 8.

Further, when the arcuate-shaped part is provided with bearings or the like, smooth engagement can be realized.

Explanation will then be made as to how to secure smooth transfer from the single-crystal pulling operation by the wire 41a to the single-crystal pulling operation by the arm-shaped members 44a by referring to FIGS. 8 to 10.

It is first assumed that a pulling speed by the wire 41a immediately before the corrugated portion is held by the arm-shaped members 44a is denoted by $V_{SE}$ as mentioned above, which condition is shown in FIG. 9. A pulling speed of the arm-shaped members 44a after the arm-shaped members 44a is engaged in the recess 16 of the corrugated portion 14 at the predetermined position is also assumed to be denoted by $V_B$. Further, the pulling speed of the wire 41a after the engagement of the arm-shaped members 44a in the recess is denoted by $V_A$. It is important that the single crystal part 15 be pulled at the speed $V_{SE}$ even after the arm-shaped members 44a are engaged. Accordingly, it becomes necessary that, during a time period (a time duration t in FIG. 10) immediately after the arm-shaped members 44a are engaged, the addition of the speeds $V_A$ and $V_B$ become the speed $V_{SE}$. Accordingly, it becomes necessary that, at an engagement position (position $t_0$ in FIG. 10) and thereafter, the speed $V_A$ gradually drops and the speed $V_B$ gradually rises from zero, as shown in FIG. 10.

The speed $V_A$ is determined by the motor 37, while the speed $V_B$ is determined by the motor 21. The controller 9 can control the rotation of the motors 37 and 21, check the load applied to the load cell 6a while satisfying a condition of $V_A+V_B=V_{SE}$, detect that the load became zero, and on the basis of the detected information, control the last pulled position by the wire 41a.

As shown in FIG. 10, at an elapsed time $t_1$, a relationship of $V_A=0$ and $V_B=V_{SE}$ is satisfied. Under this condition, when the pulling of the wire 41a is stopped, this may cause a slight impact force to be applied to the single crystal part 15. To avoid this, the wire 41a is driven in its minus direction to make the speed $V_B$ of the arm-shaped members 44a and 44a higher than $V_{SE}$. Thereafter, as illustrated, the speed $V_A$ of the wire 41a is gradually increased while the speed $V_B$ of the arm-shaped members 44a and 44a is gradually decreased. At a time position $t_2$ after passage of a time t from the time position $t_0$, when the speed $V_A$ is set at zero and the speed $V_B$ is set at $V_{SE}$, the pulling transfer from the wire 41a to the arm-shaped members 44a and 44a is completed.

According to the above method, the single crystal part 15 is pulled at the constant speed $V_{SE}$ and no impact is generated during the transfer from the wire 41a to the arm-shaped members 44a and 44a.

Although the wire has been used as the hanging member 41 in the foregoing explanation, in place of the wire a rodtype member may be used.

Further, through the lifting jig 44 has comprised such arm-shaped members 44a and 44a as illustrated, the present invention is not restricted to the specific example. Furthermore, the flexible elastic member 2 is not limited to the bellows 2a. The load measuring means 6 is also not limited to the load cell 6a but other well known techniques may be applied. Of course, as mentioned above, in the lifting-jig driving mechanism 7, the hydraulic cylinders 47 may be replaced by motors. In addition, the slider moving mechanism 1 is not restricted to the illustrated mechanism including the ball screw 17 and guide shaft 18, and the rotary mechanism 4 is also not restricted to the illustrated one.

In the present invention, it is preferable that a corrugated portion (verge:Journal of Crystal Growth 52(1981) 391–395) of a neck part formed to extinguish dislocation from the single crystal or a part of finely fluctuated diameters formed during the formation of the single crystal be positively used so that the single crystal can be held by the lifting jig. This is because the formation of the corrugated portion 14 at a desired size, shape and position by intentionally varying the diameter requires adjustment of the pulling speed of the seed crystal 12 and the temperature of melt, which in turn is difficult.

As in the present invention, however, when detection means for detecting respective positions of surfaces of the neck, cone-shaped and straight body parts of the single crystal pulled by the hanging member are located at predetermined positions of the immobile side of the apparatus; the corrugated portion having a suitable size can be formed in the neck part or in the straight body part at its suitable position so that the single crystal can be held at the corrugated portion by the lifting jig, as mentioned above.

Shown in FIG. 11 is an example of a jig suitable to hold the straight body part 15b at its portion of finely fluctuated diameters (±1–3 mm) spontaneously formed therein due to fluctuation in the single-crystal pulling speed or, to fluctuations in the temperature and convection of the melt in the crucible during the growth of the single crystal. The lifting jig 44 has semi-cylinder parts 53 and jaw parts 54 continuously connected thereto in a lower part of the arm-shaped members 44a, the jaw parts 54 being formed at their inner edges with semi-circular engagement parts 46. The provision of the semi-cylinder parts 53 provides a large strength of the lifting jig 44 in the vicinity of the engagement parts 46.

When the single crystal is held by the lifting jig at its part of finely fluctuated diameters spontaneously formed during the growth of the single crystal, the engagement parts 46 of the lifting jig are engaged in the recess of the corrugated portion of the single crystal as shown in FIG. 12, thereby the straight body part 15b of the single crystal can be reliably engaged.

Embodiment 2

Figure 13:
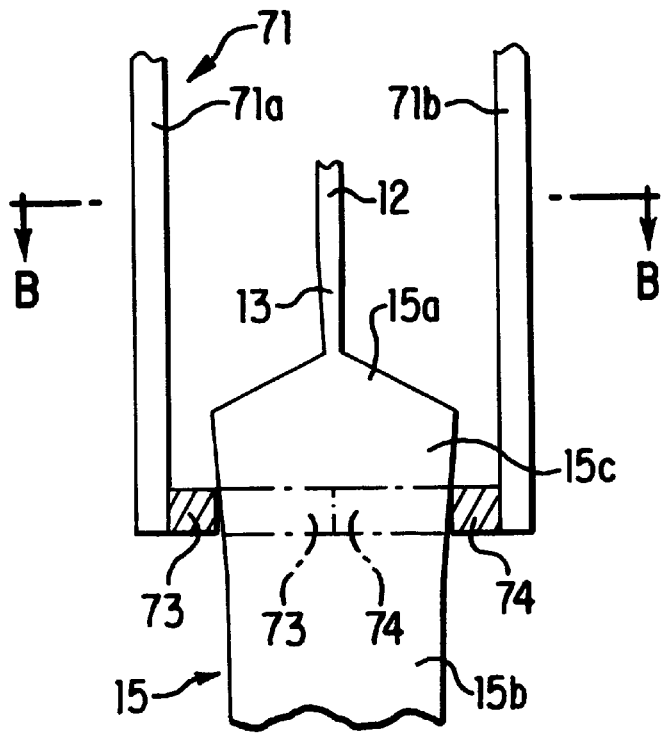
FIG. 13 is an axial cross-sectional view for explaining a shape of the single crystal during its growth and a condition in which the single crystal is held by the lifting jig in another embodiment.
Figure 15:
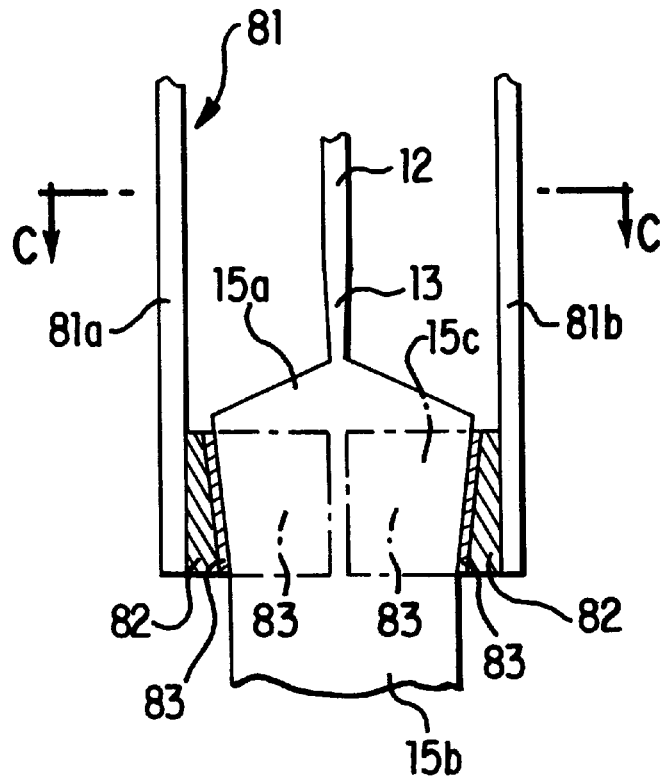
FIG. 15 is an axial cross-sectional view for explaining a condition in which the single crystal is held by another lifting jig.
Figure 16:
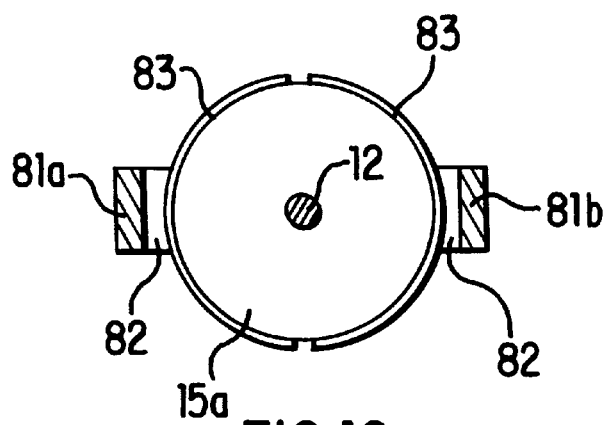
FIG. 16 is a cross-sectional view taken along line C—C in FIG. 15.
Figure 17:
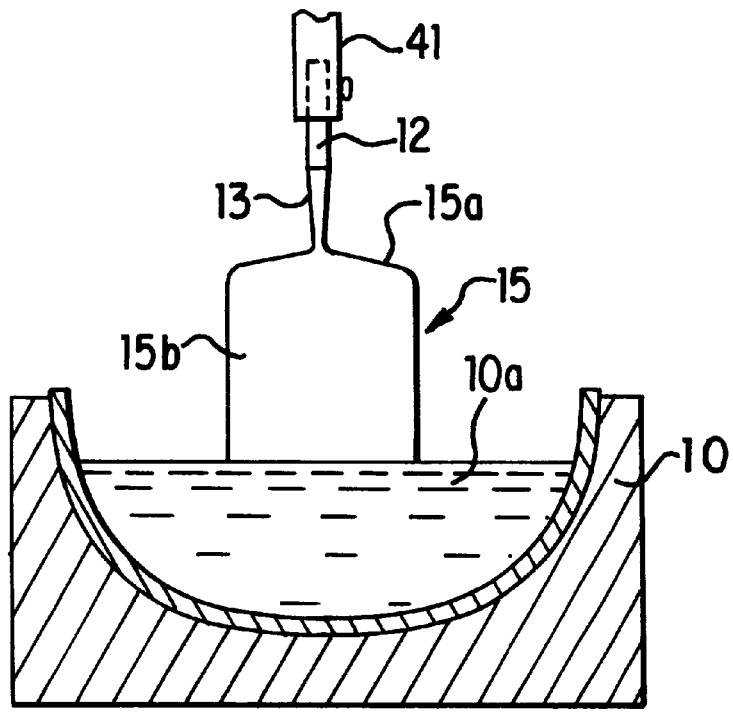
FIG. 17 is an axial partial cross-sectional view showing a prior art single crystal growing method.
Figure 18:
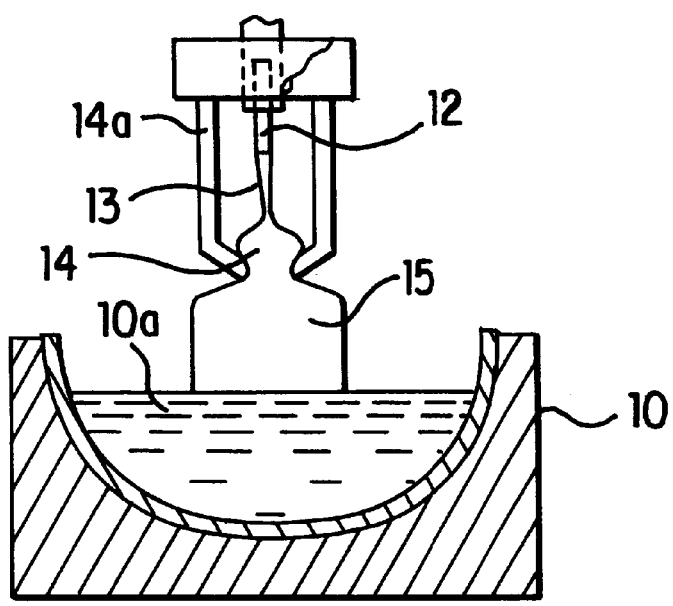
FIG. 18 is an axial partial cross-sectional view showing a conventional lifting jig used to pull a heavy-weight single crystal.

In the present embodiment, as shown in FIG. 13, the neck part 13, cone-shaped part 15a, inverted right cone part 15c having a taper of 0.1–0.3 and straight body part 15b are formed sequentially from a lower end of the seed crystal 12 to thereby form a single crystal. Usable as a lifting jig for holding the single crystal is a lifting jig having such a lower structure as shown, e.g., in FIGS. 13 and 14 or such lifting jig as shown in FIGS. 15 and 16. The holding of the single crystal is carried out by engaging the lifting jig with an outer peripheral surface of the inverted right cone part 15c.

The entire structure of the single crystal growing apparatus and the upper structure of the lifting jig are the same as those in the embodiment 1. In other words, the slider moving mechanism, flexible elastic member, retaining case, retaining-case rotating mechanism, hanging-member moving up/down mechanism, load measuring means, lifting-jig driving mechanism, detection means and controller (all not shown) are the same as those shown in FIGS. 1 and 2.

The word "taper" is used to refer to its ordinary meaning. That is, taper is a value corresponding to a division of a difference between maximum and minimum diameters of the inverted right cone part 15c by the length of the inverted right cone part 15c. The inverted right cone part 15c can grow by controlling at least one of the single-crystal pulling speed and the temperature of the melt within the crucible.

When the taper of the inverted right cone part 15c is set at 0.1–0.3, the single crystal can grow stably without any crystalline defects and the holding of the single crystal can be effected accurately and stably.

When the taper exceeds 0.3 (when the above pulling speed or temperature is largely changed as the taper exceeds 0.3), there occurs such a problem that crystal defects tend to generate in the single crystal and a processing loss becomes large during its cylindrical grinding.

When the taper is less than 0.1, it becomes difficult to accurately and stably hold the single crystal with use of the lifting jig. By processing the inverted right cone part 15c into a cylindrical shape having the same diameter as the straight body part 15b by cylindrical grinding after completion of the growth step, the inverted right cone part 15c can be treated as a single crystal product having the same quality as the straight body part 15b.

The length of the inverted right cone part 15c can be set at an arbitrary value, so long as the inverted right cone part 15c of the single crystal can be reliably held by the lifting jig. In the case of FIG. 13, since the length of the inverted right cone part 15c is set to be considerably large, the growth rate of the single crystal can be made stabler than when the inverted right cone part 15c is set to be relatively short. The inverted right cone part 15c may be made shorter than that of FIG. 13 and have a diameter corresponding to about ⅓ of the diameter of the straight body part 15b. When the inverted right cone part is made too long, a processing loss by the above cylindrical grinding becomes large. For this reason, this point should be considered.

Figure 14:
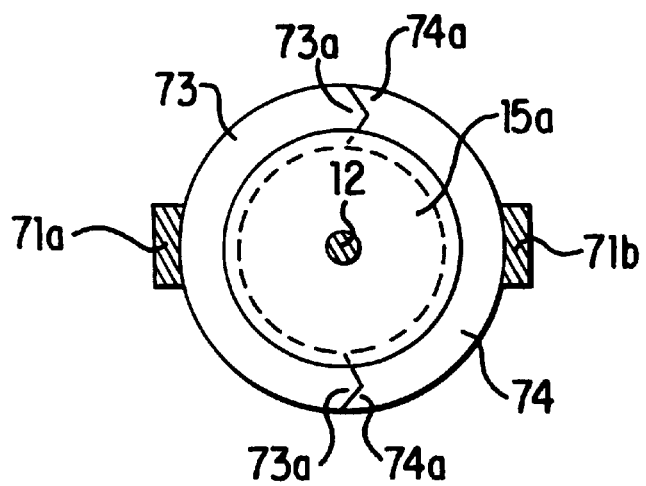
FIG. 14 is a cross-sectional view taken along line B—B in FIG. 13.

A lifting jig 71 shown in FIGS. 13 and 14 comprises a pair of arm-shaped members 71a and 71b. Like the arm-shaped members 44a and 44a in the embodiment 1, the arm-shaped members 71a and 71b are intersected at their intermediate parts, which intersected portions are coupled to each other by a pin (not shown). The arm-shaped members 71a and 71b are provided at their lower ends with semi-circular parts 73 and 74 respectively, inner peripheral surfaces of which are engagements for holding of the single crystal.

That is, as shown in FIG. 14, the semi-circular part 73 is formed at its tip end with projections 73a, whereas, the semi-circular part 74 is formed in its tip end with recesses 74a into which the projections 73a are to be fitted. Accordingly, when the semi-circular parts 73 and 74 are made to approach each other, the projections 73a are fitted into the recesses 74a to form a nearly perfect circular ring member as shown in FIG. 14.

In order to hold the single crystal part 15 by the lifting jig 71, the semi-circular parts 73 and 74 are previously moved down to a position of the straight body part 15b, where the projections 73a are fitted into the recesses 74a to form said circular ring member, and then the circular ring member is moved up, thereby the semi-circular parts 73 and 74 are engaged on its inner peripheral surface with the outer peripheral surface of the inverted right cone part 15c.

In this case, the weight of the single crystal part 15 causes a force tending to open the circular ring member. However, since the semi-circular parts 73 and 74 are fitted in the projection/recess engagement relation as mentioned above, these semi-circular ring parts will not be separated from each other. After the single crystal fully grows, the actuation of the hydraulic cylinders (not shown) causes an interval between the arm-shaped members 71a and 71b to be enlarged, so that the semi-circular ring parts can be easily separated from each other.

In this way, the semi-circular ring parts 73 and 74 can be coupled with each other and separated from each other through the simple operation. And after the semi-circular parts are coupled with each other, even when the load of the single crystal is applied to the coupled semi-circular ring parts, the coupled semi-circular ring parts will not be separated from each other, thus enabling positive holding of the single crystal.

A lifting jig 81 shown in FIGS. 15 and 16 comprises a pair of arm-shaped members 81a and 81b. These arm-shaped members 81a and 81b are provided at their lower ends with inverted semi-cone parts 83 through reinforcing members 82 respectively.

The inner peripheral surfaces of the inverted semi-cone parts 83 have the same taper as that of the inverted right cone part 15c. When the arm-shaped members 81a and 81b approach each other, these members form a nearly perfect inverted right cone, as a result of which the inner peripheral surfaces form engagements for holding of the single crystal.

The present invention exhibits remarkable effects which follow.

1) The single crystal part is not supported only by its neck part but pulled as supported on the way by the lifting jig, so that drop of the single crystal part will not occur during the pulling operation. Accordingly, safe pulling operation can be realized.

2) When the pulling of the single crystal part by the hanging member is shifted to the pulling by the lifting jig, the both pulling speeds are synchronously controlled so that the pulling is carried out always at a constant pulling speed, whereby an impact on the single crystal part can be minimized and a dislocation-free single crystal can be produced.

3) Since such a method is employed as to use the detection means to specify the position of engagement between the lifting jig and corrugated portion, the engagement of the both can be smoothly carried out, thus preventing impact generation when the both are engaged.

4) By using the load measuring means, the pull stop state by the hanging member can be accurately confirmed.

5) The cone-shaped part, inverted right cone part having a taper of 0.1–0.3 and straight body part are sequentially formed in the single crystal growth step, and the lifting jig is engaged with the outer peripheral surface of the inverted right cone part to thereby hold the single crystal, whereby the single crystal can be accurately and stably held. Further, the inverted right cone part can grow without any crystal defects therein. Thus when the inverted right cone part is cut into a cylinder shape, the cone part can be treated as a single crystal product having the same quality as the straight body part.

We claim:

1. A method for growing a single crystal having a neck part continuously connected to a seed crystal, a cone part and a straight body part, characterized in that said neck part, cone part and straight body part are formed by pulling a hanging member connected to said seed crystal, a lifting jig is engaged in a recess in a corrugated portion on a surface of said single crystal which is moved up to a position by raising the hanging member, a load pulled by the hanging member is shifted to the lifting jig and thereafter pulling operation of the single crystal is carried out by the lifting jig.

2. A method for growing a single crystal as set forth in claim 1, characterized in that the corrugated portion on said single crystal surface is formed as a result of fine fluctuations in diameter caused by variations in temperature, pulling speed and convection during growth of said single crystal.

3. A method for growing a single crystal as set forth in claim 1, characterized in that a corrugated portion of said neck part is formed as a verge for the purpose of causing dislocation to disappear from the single crystal.

4. A method for growing a single crystal as set forth in claim 1, characterized in that said neck part, said cone part and a corrugated portion of said straight body part are intentionally formed.

5. A method for growing a single crystal as set forth in claim 1, characterized in that a pulling speed $V_B$ of said lifting jig is increased gradually from zero immediately after the engagement of said lifting jig so that a speed V corresponding to an addition of said pulling speed $V_B$ of the lifting jig to a pulling speed $V_A$ of said hanging member after the engagement of said lifting jig is equal to a pulling speed $V_{SE}$ of said hanging member immediately before said lifting jig is engaged and in synchronism therewith, the pulling speed $V_A$ of said hanging member is decreased gradually from the speed $V_{SE}$.

6. A method for growing a single crystal as set forth in claim 5, characterized in that a load pulled by said hanging member is measured so that, after a measured load value becomes zero, the pulling speed $V_A$ of the hanging member is set at zero.

7. A method for growing a single crystal having a neck part under a seed crystal, a cone part, an inverted right cone part having a taper of 0.1–0.3 and straight body part in this order, characterized in that a lifting jig is engaged with an outer peripheral surface of said inverted right cone part which is moved up to a position by raising the hanging member connected to said seed crystal, a load pulled by the hanging member is shifted to the lifting jig and thereafter pulling operation of the single crystal is carried out by the lifting jig.

8. A method for growing a single crystal as set forth in claim 7, characterized in that said inverted right cone part is formed by controlling at least one of a pulling speed of the single crystal and a temperature of a melt within a crucible.

9. An apparatus for growing a dislocation-free single crystal having a neck part continuously connected to a seed crystal, a cone part and a straight body part, characterized in that said neck part continuously connected to said seed crystal, said cone part and a part of said straight body parts are formed, said single crystal is hanged by a hanging member connected to said seed crystal and by a lifting jig engaged in a recessed portion of a corrugated portion on a surface of said single crystal, said dislocation-free single crystal is formed by pulling the single crystal without applying any vibration or impact on the single crystal, and said hanging member and lifting jig are provided to be moved up and down independently of each other.

10. An apparatus for growing a dislocation-free single crystal having a neck part under a seed crystal, a cone part, an inverted right cone part having a taper of 0.1–0.3 and a straight body part in this order, characterized in that said single crystal is hanged by a hanging member connected to said seed crystal and by a lifting jig engaged with an outer peripheral surface of said inverted right cone part, said single crystal is formed by pulling the dislocation-free single crystal without applying any vibration and impact on the single crystal, and said hanging member and lifting jig are provided to be moved up and down independently of each other.

11. An apparatus for growing a dislocation-free single crystal having a neck part continuously connected to a seed crystal, a cone part and a straight body part, characterized in that said neck part continuously connected to said seed crystal, said cone part and a part of said straight body part are formed, said single crystal is hanged by a hanging member connected to said seed crystal and by a lifting jig engaged in a recessed portion of a corrugated portion on a surface of said single crystal, said dislocation-free single crystal is formed by pulling the single crystal without applying any vibration or impact on the single crystal; said apparatus comprising a slider disposed as opposed to a crucible containing a melt of semiconductor material, a slider moving mechanism engaged with said slider for moving and guiding the slider in a vertical direction at a speed $V_B$, a retaining case pivotably supported on said slider moving mechanism, a mechanism for rotating said retaining case, a hanging member moving up/down mechanism provided in said retaining case for moving the hanging member connected to said seed crystal at a speed $V_A$, load measuring means for measuring a load applied to the hanging member moving up/down mechanism as the hanging member is moved, lifting-jig driving mechanism for moving said lifting jig provided in said retaining case to be releasably engaged in a recess in said corrugated portion toward said recess or away therefrom, and a controller connected to said slider moving mechanism, retaining-case rotating mechanism, hanging-member moving up/down mechanism, load measuring means and lifting-jig driving mechanism for performing synchronous control over these mechanisms and means; said controller controls said speeds $V_A$ and $V_B$ at least in such a manner that an addition of the pulling speed $V_A$ of said hanging member by said hanging-member moving up/down mechanism and the speed $V_B$ of the lifting jig to be engaged in said recess becomes equal to a pulling speed $V_{SE}$ of said hanging member immediately before said lifting jig is engaged in said recess.

12. An apparatus for growing a single crystal as set forth in claim 11, characterized in that moving-up speeds of said hanging member and lifting jig are controlled by a diameter controller.

13. An apparatus for growing a single crystal as set forth in claim 11, characterized in that said crucible is provided within a heating chamber, a crystal unloading chamber is provided above said heating chamber, and said crystal unloading chamber is formed to be expanded and contracted in its vertical direction.

14. An apparatus for growing a single crystal as set forth in claim 11, characterized in that said crystal exit chamber comprises a bellows.

15. An apparatus for growing a single crystal as set forth in claim 11, characterized in that said lifting jig comprises a pair of arm-shaped members intermediate parts of which are pivoted to said retaining case and which are provided at their lower ends with engagements to be engaged in the recess of said corrugated portion, and said lifting-jig driving mechanism comprises a pair of hydraulic cylinders or motors coupled to upper ends of said arm-shaped members.

16. An apparatus for growing a single crystal as set forth in claim 15, characterized in that said engagements are integrally formed with said arm-shaped members.

17. An apparatus for growing a single crystal as set forth in claim 11, characterized in that detection means for detecting positions of surfaces of said neck part, cone part and straight body part of the single crystal pulled by said hanging member are disposed at positions on an immoble side of said apparatus.

18. An apparatus for growing a dislocation-free single crystal having a neck part under a seed crystal, a cone part, an inverted right cone part having a taper of 0.1–0.3 and a straight body part in this order, characterized in that said single crystal is hanged by a hanging member connected to said seed crystal and by a lifting jig engaged with an outer peripheral surface of said inverted right cone part, said single crystal is formed by pulling the dislocation-free single crystal without applying any vibration and impact on the single crystal; said apparatus comprising a slider disposed as opposed to a crucible containing a melt of semiconductor material, a slider moving mechanism engaged with said slider for moving and guiding the slider in a vertical direction at a speed $V_B$, a retaining case pivotably supported on said slider moving mechanism, a mechanism for rotating said retaining case, a hanging member moving up/down mechanism provided in said retaining case for moving the hanging member connected to said seed crystal at a speed $V_A$, load measuring means for measuring a load applied to the hanging member moving up/down mechanism as the hanging member is moved, lifting jig driving mechanism for moving said lifting jig provided in said retaining case to be releasably engaged in an outer peripheral surface of said inverted right cone part toward said outer peripheral surface or away therefrom, and a controller connected to said slider moving mechanism, retaining-case rotating mechanism, hanging-member moving up/down mechanism, load measuring means and lifting jig driving mechanism for performing synchronous control over these mechanisms and means; said controller controls said speeds $V_A$ and $V_B$ at least in such a manner that an addition of the pulling speed $V_A$ of said hanging member by said hanging-member moving up/down mechanism and the speed $V_B$ of the lifting jig to be engaged on an outer peripheral surface of said inverted right cone part becomes equal to a pulling speed $V_{SE}$ of said hanging member immediately before said lifting jig is engaged on the outer peripheral surface of said inverted right cone part.

19. An apparatus for growing a single crystal as set forth in claim 18, characterized in that said lifting jig comprises a pair of arm-shaped members intermediate parts of which are pivoted to said retaining case and which are provided at their lower ends with engagements to be engaged with an outer peripheral surface of said inverted right cone part, and said lifting-jig driving mechanism comprises a pair of hydraulic cylinders or motors coupled to upper ends of said arm-shaped members.

20. An apparatus for growing a single crystal as set forth in claim 12, characterized in that detection means for detecting positions of surfaces of said neck part, cone part, inverted right cone part and straight body part of the single crystal pulled by said hanging member are disposed at positions on an immoble side of said apparatus.

* * * * *